(12) United States Patent
Agarwal et al.

(10) Patent No.: US 8,347,240 B2
(45) Date of Patent: Jan. 1, 2013

(54) SPLIT-LAYER DESIGN FOR DOUBLE PATTERNING LITHOGRAPHY

(75) Inventors: Kanak B. Agarwal, Austin, TX (US); Lars W. Liebmann, Poughquag, NY (US); Sani R. Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 12/915,923

(22) Filed: Oct. 29, 2010

(65) Prior Publication Data

US 2012/0110521 A1 May 3, 2012

(51) Int. Cl.
*G06F 17/50* (2006.01)
*G06F 19/00* (2006.01)
*G03F 1/00* (2006.01)
*G21K 5/00* (2006.01)

(52) U.S. Cl. ............. 716/54; 716/52; 716/53; 716/55; 716/103; 716/136; 700/119; 700/120; 700/121; 430/5; 378/35

(58) Field of Classification Search ............. 716/52, 716/53, 54, 55, 103, 106, 111, 136; 700/119, 700/120, 121; 430/5; 378/35
See application file for complete search history.

(56) References Cited

U.S. PATENT DOCUMENTS

| | | | | |
|---|---|---|---|---|
| 6,775,806 B2* | 8/2004 | Li | | 716/112 |
| 7,138,212 B2 | 11/2006 | Hsu et al. | | |
| 7,228,523 B2* | 6/2007 | Kobayashi | | 716/52 |
| 7,568,179 B1 | 7/2009 | Kroyan et al. | | |
| 7,617,476 B2 | 11/2009 | Hsu et al. | | |
| 7,666,554 B2 | 2/2010 | Hsu et al. | | |
| 7,830,583 B2* | 11/2010 | Neuman et al. | | 359/265 |
| 2003/0229860 A1* | 12/2003 | Li | | 716/1 |
| 2005/0160393 A1* | 7/2005 | Kobayashi | | 716/19 |
| 2006/0168551 A1* | 7/2006 | Mukuno | | 716/5 |
| 2007/0124709 A1* | 5/2007 | Li et al. | | 716/5 |
| 2009/0125866 A1 | 5/2009 | Wang et al. | | |
| 2010/0021055 A1 | 1/2010 | Socha | | |
| 2010/0037200 A1 | 2/2010 | Ghan et al. | | |

(Continued)

OTHER PUBLICATIONS

Chiou, Tsan-Bim et al., "Development of Layout Split Algorithms and Printability Evaluation for Double Patterning Technology", Proc. of SPIE vol. 6924, 2008, 10 pages.

(Continued)

*Primary Examiner* — Phallaka Kik

(74) *Attorney, Agent, or Firm* — Francis Lammes; Stephen J. Walder, Jr.; Libby Z. Toub

(57) ABSTRACT

A mechanism is provided for converting a set of single-layer design rules into a set of split-layer design rules for double patterning lithography (DPL). The set of single-layer design rules and minimum lithographic resolution pitch constraints for single exposure are identified. The set of single-layer design rules comprise a first plurality of minimum distances that are required by a set of first shapes in a single-layer design. Each of the first plurality of minimum distances in the set of single-layer design rules are modified with regard to the minimum lithographic resolution pitch constraints for single exposure, thereby forming the set of split-layer design rules. The set of split-layer design rules comprise a second plurality of minimum distances that are required by a set of second shapes and a set of third shapes in a split-layer design. The set of split-layer design rules are then coded into a design rule checker.

21 Claims, 6 Drawing Sheets

U.S. PATENT DOCUMENTS

2012/0094219 A1* 4/2012 Fujimura et al. .................. 430/5

OTHER PUBLICATIONS

Chiou, Tsann-Bim et al., "Full-Chip Pitch/Pattern for Lithography and Spacer Double Patterning Technologies", Proceedings of the SPIE—The International Society for Optical Engineering, vol. 7140, pp. 71401Z, abstract only.

Drapeau, Martin et al., "Double Patterning Design Split Implementation and Validation for the 32nm Node", Proc. of SPIE vol. 6521, 2007, 15 pages.

El-Gamal, A et al., "Decomposition Algorithm for Double Patterning of Contacts and Via Layers", Proceedings of the SPIE—The International Society for Optical Engineering, vol. 7470, pp. 747008, abstract only.

Gheith, M et al., "OPC for Reduced Process Sensitivity in the Double Patterning Flow", Proceedings of the SPIE—The International Society for Optical Engineering, vol. 7274, pp. 727419, abstract only.

Gupta, Mohit et al., "Timing Yield-Aware Color Reassignment and Detailed Placement Perturbation for Double Patterning Lithography", ICCAD '09, Nov. 2-5, 2009, pp. 607-614.

Kahng, Andrew B. et al., "Layout Decomposition for Double Patterning Lithography", IEEE 2008, pp. 465-472.

Seo, Beom-Seok et al., "Double Patterning Addressing Imaging Challenges for Near- and Sub-K1=0.25 Node Layouts", Proceedings of the SPIE—The International Society for Optical Engineering, vol. 7379, pp. 73791N, abstract only.

Yuan, Kun et al., "Double Patterning Layout Decomposition for Simultaneous Conflict and Stitch Minimization", ISPD '09, Mar. 29-Apr. 1, 2009, ACM, pp. 107-114.

Zeggaoui, N. et al., "Resolving Contact Conflict for Double Patterning Split", Proceedings of the SPIE—The International Society for Optical Engineering, vol. 7488, pp. 74882K, abstract only.

* cited by examiner

| | SINGLE-LAYER RULES 400 | SPLIT-LAYER INTRA-LAYER RULES 420 |
|---|---|---|
| 402 MINIMUM WIDTH | 32nm | 32nm 422 |
| 404 MINIMUM SPACE | 32nm | 96nm 424 |
| 406 MINIMUM PITCH | 64nm | 128nm 406 |
| 408 MINIMUM AREA | 0.01 μm² | 0.01 μm² 428 |
| 410 MIN TIP2TIP | 32nm | 64nm 430 |
| 412 MIN TIP2SIDE | 32nm | 64nm 432 |
| 414 MIN ENCLOSURE LAYER PAST VIA | 15nm | 15nm 434 |

| | SPLIT-LAYER INTER-LAYER RULES FOR PITCH SPLITTING DOUBLE PATTERNING 442 | SPLIT-LAYER INTER-LAYER RULES FOR SPACER DOUBLE PATTERNING 444 |
|---|---|---|
| 446 MINIMUM SPACE LAYER 1 TO LAYER 2 | 32nm | ==32nm or >=96nm |
| 448 MINIMUM OVERLAP | 32nm | not allowed |

SPLIT-LAYER DESIGN FOR DOUBLE PATTERNING LITHOGRAPHY

BACKGROUND

The present application relates generally to an improved data processing apparatus and method and more specifically to mechanisms for a split-layer design for double patterning lithography.

Double patterning lithography (DPL) is a natural extension to single patterning lithography that uses two separate patterning processes to form two coarser patterns which are combined to form a single finer pattern. DPL is currently the forerunner for technology nodes beyond the 22 nm node. The paradigm of double patterning could be further extended to triple patterning lithography, and even quadruple patterning lithography.

There are different DPL process technologies being developed, e.g., double exposure (DE), DP with intermediate etch (a.k.a. litho-etch-litho-etch—LELE), and self-aligned spacer processing. All of the DPL processes have more processing steps/cost and lower throughput than the single patterning lithography. These DPL processes also have different costs and requirements on material/process as well as design/patterning constraints. DE is the simplest in terms of the process with two exposures and one etch, but provides limited design shrink benefits. LELE and spacer technologies can generate finer pitches than DE, but they require more processing steps. For example, LELE needs two exposures, two masks, two etches; and spacer needs even more steps. LELE can generate flexible patterns, but it puts more burdens on overlay control. For the self-aligned spacer processing, the overlay can be better controlled. But since the spacers are formed on the perimeter of a sacrificial first pattern, only very regular patterns can be generated.

No matter what DPL processes are used, they all pose new challenges to nanometer circuit design and electronic design automation (EDA) tools. A major challenge is the overlay errors, including shifting, rotation, and magnification errors. These overlay errors will cause both back end of line (BEOL) (interconnect) as well as front end of line (FEOL) (transistor critical dimension) variations. Circuit analysis tools also have to take into consideration these DPL-induced variations.

DPL requires layout decomposition, which is post-design, that decomposes the original layout into two separate masks (or colors), subject to minimum spacing constraints on each mask. The decomposition first needs to make sure that the design is decomposable, i.e., the design can be decomposed without any coloring conflict. Meanwhile, the number of stitches (where a layout feature is split into two masks) shall be minimized during layout decomposition for printed image robustness. Intelligent layout decomposition can also play a proactive role in mitigating the overlay-induced variations.

SUMMARY

In one illustrative embodiment, a method, in a data processing system, is provided for converting a set of single-layer design rules into a set of split-layer design rules for double patterning lithography (DPL). The illustrative embodiment identifies the set of single-layer design rules and minimum lithographic resolution pitch constraints for single exposure. In the illustrative embodiment, the set of single-layer design rules comprise a first plurality of minimum distances that are required by a set of first shapes in a single-layer design. The illustrative embodiment modifies each of the first plurality of minimum distances in the set of single-layer design rules with regard to the minimum lithographic resolution pitch constraints for single exposure, thereby forming the set of split-layer design rules. In the illustrative embodiment, the set of split-layer design rules comprise at least a second plurality of minimum distances that are required by a set of second shapes and a set of third shapes in a split-layer design. The illustrative embodiment then codes the set of split-layer design rules into a design rule checker for use in designing a double patterning lithography design.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 4 depicts an example of a set of single-layer design rules that are converted into a set of split-layer design rules in accordance with an illustrative embodiment;

DETAILED DESCRIPTION

As stated previously, DPL requires layout decomposition, which is post-design, that decomposes the original layout into two separate masks (or colors), subject to minimum spacing constraints on each mask. The decomposition first needs to make sure that the design is decomposable, i.e., the design can be decomposed without any coloring conflict. Meanwhile, the number of stitches (where a layout feature is split into two masks) shall be minimized during layout decomposition for printed image robustness.

However, layout decomposition is usually done during mask data preparation. If the input layout, i.e. the design, is not double patterning friendly, it may be impossible to decompose without any coloring conflict. Thus, the illustrative embodiments provide a mechanism for expressing double patterning lithography (DPL) decomposition constraints as a set of split-layer design rules. Using the DPL split-layer design rules, DPL coloring constraints may be enforced during the design stage versus current methods that are implemented post-design in the decomposition stage. By implementing the DPL split-layer design rules in the design phase, no expensive post-design layout decomposition or conflict removal is required.

Figure 1:
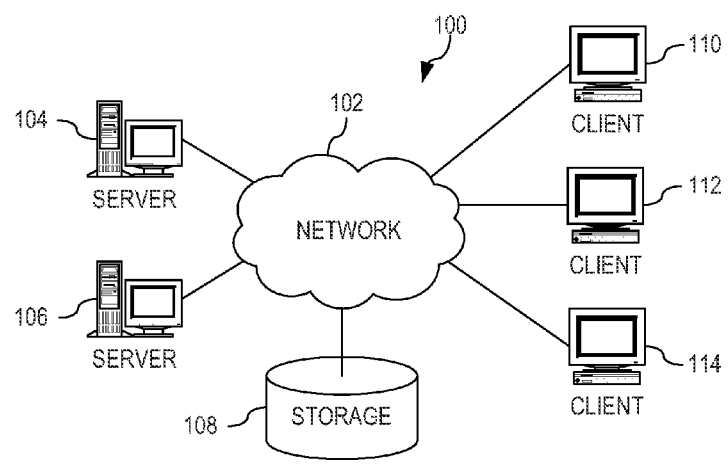
FIG. 1 depicts a pictorial representation of an example distributed data processing system in which aspects of the illustrative embodiments may be implemented.
Figure 2:
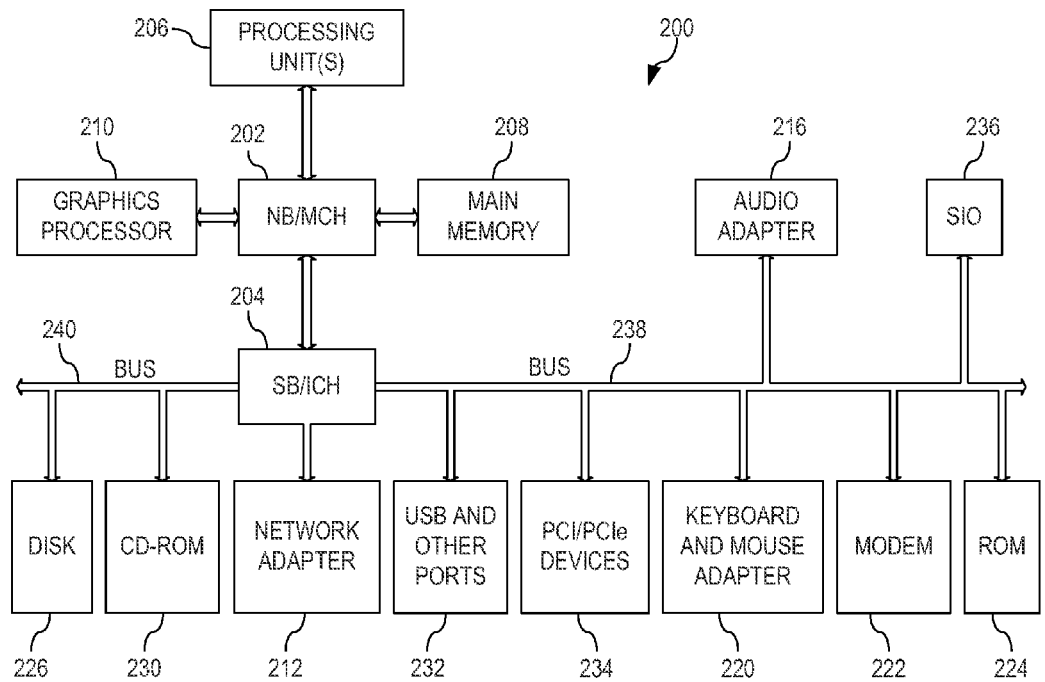
FIG. 2 shows a block diagram of an example data processing system in which aspects of the illustrative embodiments may be implemented.

Thus, the illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as example environments in which aspects of the illustrative embodiments may be implemented. While the description following FIGS. 1 and 2 will focus primarily on a single data processing device implementation of a mechanism for expressing double patterning lithography (DPL) decomposition constraints as a set of split-layer design rules, this is only an example and is not intended to state or imply any limitation with regard to the features of the present invention. To the contrary, the illustrative embodiments are intended to include distributed data processing environments and embodiments in which double patterning lithography (DPL) decomposition constraints may be expressed as a set of split-layer design rules.

With reference now to the figures and in particular with reference to FIGS. 1-2, example diagrams of data processing environments are provided in which illustrative embodiments of the present invention may be implemented. It should be appreciated that FIGS. 1-2 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

As discussed previously, double patterning lithography (DPL) is an effective technique in improving the resolution of single patterning lithography in that double patterning lithograph may double the lithographic resolution of single patterning lithography. That is, in order for more elements to be placed in a smaller area on a wafer source, DPL may double the lithographic resolution through the use of pitch splitting. In single patterning optical lithography, a light source of a specified wavelength projects through a mask to achieve a spatially distributed intensity field on a wafer source. After chemical reactions of photo-resist on the wafer source, a final wafer image forms on the wafer source. However, conventional lithography limits the pitch in single patterning lithography to values higher than the minimum pitches required by the future technology nodes. Pitch is the width of an element plus the space to the next element.

Double patterning lithography improves on single patterning lithograph by increasing the effective pitch through pitch splitting. However, DPL requires layout decomposition, which is post-design, that decomposes the original layout into two separate masks (or colors), subject to minimum spacing constraints (pitch) on each mask.

Figure 3:
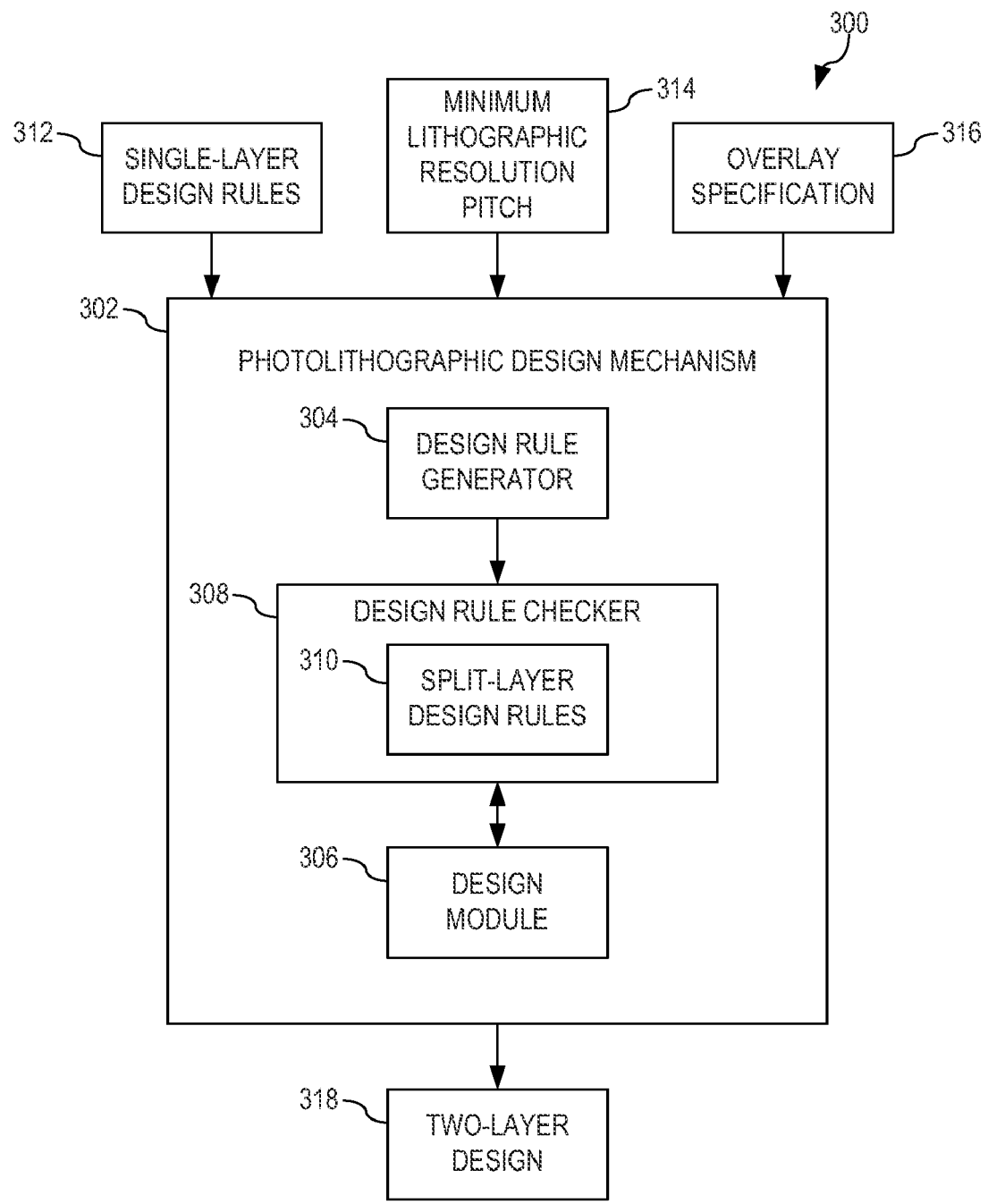
FIG. 3 depicts a block diagram of a mechanism for generating a set of split-layer design rules that are implemented during the design phase based on double patterning lithography (DPL) decomposition constraints and validating split-layer designs using the set of split-layer design rules in accordance with the illustrative embodiments.

FIG. 3 depicts a block diagram of a mechanism for generating a set of split-layer design rules that are implemented during the design phase based on double patterning lithography (DPL) decomposition constraints and validating split-layer designs using the set of split-layer design rules in accordance with the illustrative embodiments. Data processing system 300 comprises photolithographic design mechanism 302 that further comprises design rule generator 304, design module 306, and design rule checker 308. In order to generate a set of split-layer design rules 310, design rule generator 304 receives a set of single-layer design rules 312 and a minimum lithographic resolution pitch for single exposure 314 that is to be used for transforming single-layer design rules 312 into the set of split-layer design rules 310. The set of single-layer design rules 312 and the minimum lithographic resolution pitch for single exposure 314 may each be technology specific, that is, there may be different design rules and different resolution pitches for different technologies, such as 22 nm and 14 nm technologies.

Design rule generator 304 then modifies the set of single-layer design rules 312 into the set of split-layer design rules 310 by generating a set of intra-layer rules for the decomposition layers in the set of split-layer design rules 310 and by generating a set of inter-layer rules for elements between the decomposition layers in the set of split-layer design rules 310. That is, in generating the intra-layer rules, design rule generator 304 may reuse some existing single-layer rules while modifying other single-layer design rules. For example, if Mx layer is to be printed using double patterning and Mx1 and Mx2 represent the decomposition layers corresponding to the first and second patterning of the Mx layer, design rule generator 304 will take the single-layer Mx design rules and modify these rules to generate intra-layer and inter-layer rules for the double patterning layers Mx1 and Mx2. Design rule generator 304 may generate the decomposition layer rules according to a scheme where intra-layer minimum spacing (or pitch) rules for each of the decomposed layers (for example, Mx1-to-Mx1 spacing rules and Mx2-to-Mx2 spacing rules) are modified such that the minimum spacing in the decomposed layers is, for example, three times the minimum spacing in the single-layer rules (or the minimum pitch in the decomposed layers is, for example, two times the minimum pitch in the single-layer rules). The scheme may be predefined by a manufacturing team that assess double patterning constraints in order to develop a scheme that maps single-layer rules to split-layer rules.

Design rule generator 304 may also modify certain spacing rules such that line tip-to-line tip spacing and line tip-to-line side spacing rules such that minimum tip-to-tip and tip-to-side spacing rules in the decomposed layers are, for example, two times the corresponding minimum spacing rules in the single-layer rules. Alternatively, design rule generator 304 may explicitly set the minimum spacing (or pitch) rules for the decomposed layers based on the minimum lithographic resolution pitch for single exposure 314. Design rule generator 304 may also reuse some of the intra-layer rules for each of the decomposed layers from the single-layer design rules 312. These single-layer design rules 312 include minimum width, minimum area, and interaction rules with respect to other design layers (for example, Mx1 coverage of via rules and Mx2 coverage of via rules).

Design rule generator 304 may further keep inter-layer spacing rules between the decomposed layers (for example, Mx1 to Mx2 spacing rules) the same as the minimum spacing rules in the single-layer design rules 312. Additionally, design rule generator 304 may generate new inter-layer overlap rules to specify the minimum overlap between the decomposition layers whenever the two layers touch. Design rule generator 304 may also generate minimum overlap rules based on supplied technology specific overlay specifications 316. Design rule generator 304 generates the minimum overlap rules such that robust printability is achieved in the presence of worst case overlay between the two masks in the double patterning.

While the above description describes design rule generator 304 generating the intra-layer and then inter-layer design rules using different values using a multiplier, such as three times and two times, the illustrative embodiments recognize that any multiplier may be used without departing from the spirit and scope of the invention. The multiplier depends on a maximum achievable lithographic resolution of single exposure which sets the minimum width, spacing, or the like, constraints on the layout features that may be printed using single exposure. The objective of the multiplier is to set split-layer rules that allow printing of layout features as densely as possible during each exposure while maintaining acceptable lithographic process window. Thus, design rule generator 304 may use multipliers such as 1.5, 1.88, 2.5, or the like to generate a minimum spacing, minimum pitch, or any value in generating the intra-layer and the inter-layer rules. Additionally, design rule generator 304 may generate different rules for different types of double patterning lithography. That is, while design rule generator 304 may generate one set of intra-layer and inter-layer design rules for pitch splitting or double patterning, design rule generator 304 may generate a different set of intra-layer and inter-layer design rules for triple patterning, and yet another set of set of intra-layer and inter-layer design rules for spacer double patterning. The set of intra-layer and inter-layer design rules generated by design rule generator 304 is based on the scheme defined by the technology manufacturer and provided to design rule generator 304.

FIG. 4 depicts an example of a set of single-layer design rules that are converted into a set of split-layer design rules in accordance with an illustrative embodiment. FIG. 4 depicts a set of single-layer design rules 400 that may be received by a design rule generator, such as design rule generator 304 of FIG. 3. The set of single-layer design rules 400 may comprise, for example, a minimum width distance 402, a minimum space distance 404, a minimum pitch distance 406, a minimum area distance 408, a minimum tip2tip distance 410, a minimum tip2side distance 412, and a minimum enclosure layer past via distance 414, or the like.

As stated above, a design rule generator may reuse some existing single-layer rules while modifying other single-layer design rules. FIG. 4 also depicts a set of split-layer intra-layer design rules 420 that may be generated by the design rule generator. As is illustrated in this example, the minimum width distance 422, the minimum area 428, and the minimum enclosure layer past via distance 434 are reused for intra-layer rules. Also, the minimum space distance 424 has been tripled while the minimum pitch distance 426, the minimum tip2tip distance 430, and the minimum tip2side distance 432 have been doubled.

Further additions may also include split-layer inter-layer design rules 440 that may include new rules dedicated to specific types of double patterning lithography that may use the split-layer design rules 440. For example, for pitch splitting (PS) double patterning lithography (DPL) 442 and for sidewall image transfer (SIT) DPL 444, split-layer design rules 440 may include a minimum space distance 446 from the first layer to the second layer and a minimum overlap distance 448 required in areas where the first layer will overlap the second layer.

Returning to FIG. 3, once design rule generator 304 has generated the set of split-layer design rules 310, design rule generator 304 codes the set of split-layer design rules 310 into design rule checker 308. Using the set of split-layer design rules 310 and design rule checker 308, a designer may now design photolithographic masks in two layers as opposed to only producing a single-layer mask which would later be decomposed during manufacturing. That is, a designer uses design module 306 to design a mask layout using two different colors, one color representing the first layer and a second color representing the second layer. Design module 306 may be an application program interface (API) that is viewable by the designer in a graphical user interface (GUI). As the designer creates the design, design rule checker 308 may be employed to verify whether the shapes that are being provisioned are valid with respect to the set of split-layer design rules 310. Design rule checker 308 may be set up actively to validate each shape as it is being provisioned with respect to the other shapes already provisioned or to perform periodic checks so as not to interrupt a designer as frequently, or may be set up passively so that design rule checker 308 only runs when requested by the designer.

As design rule checker 308 executes, design rule checker 308 verifies for all of the shapes in the design that each of the rule required for the design have not been violated. That is, once the set of split-layer design rules 310 have been established, design rule checker 308 examines each polygon in the layout, measures certain layout parameters such as spacing, width, or the like, for layout features, and compares these measurements to the set of split-layer design rules 310. If a physical measurement violates one or more of the set of split-layer design rules 310, then design rule checker 308 flags an error indicating which rule was violated for which set of polygons. In the event that design rule checker 308 identifies a portion of the design that violates one or more of the set of split-layer design rules 310, then design rule checker may identify to the designer the exact rule that was violated as well as placing an identifier in the design indicating the location where the rule was violated. Design module 306 may display the design in the GUI as well as the identifier indicating the section of the design where the violation is located. The identifier may be a in the form of a highlighted area, a geometric figure surrounding the area, or the like. Design module 306 may also indicate the exact rule that was violated as a separate window associated with the design API, as a pop-up as the designer mouses over an identified section of the design, or the like.

The designer may then use the features of design module 306 to make corrections to the design and rerun design rule checker 308 to validate the changes are in line with the set of split-layer design rules 310. Once the design has been validated by design rule checker 308, design module 306 generates two-layer design 318 that may be sent to manufacturing without needing to be decomposed.

Thus, photolithographic design mechanism 302 provides for explicitly specifying double patterning decomposition constraints as a set of split-layer design rules. Each layer designed by the designer may now be viewed as two separate layers corresponding to first and second exposure respectively. The design treats these two layers as different layers during design even though both layers represent the same design layer. The split-layer design rules specify inter-layer and intra-layer rules for the two exposure layers to ensure manufacturability and DPL compatibility as well as providing an efficient way to enforce DPL constraints during design through the set of split-layer design rules.

Figure 5B:
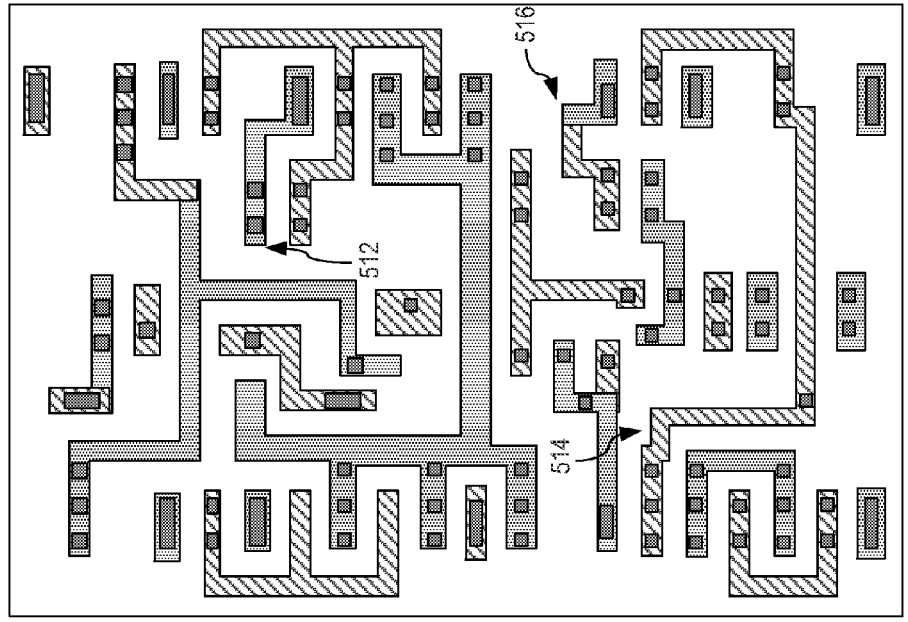
FIG. 5B depicts a redesigned two-layer design that addresses the violation identified by the design rule checker in accordance with an illustrative embodiment.
Figure 5A:
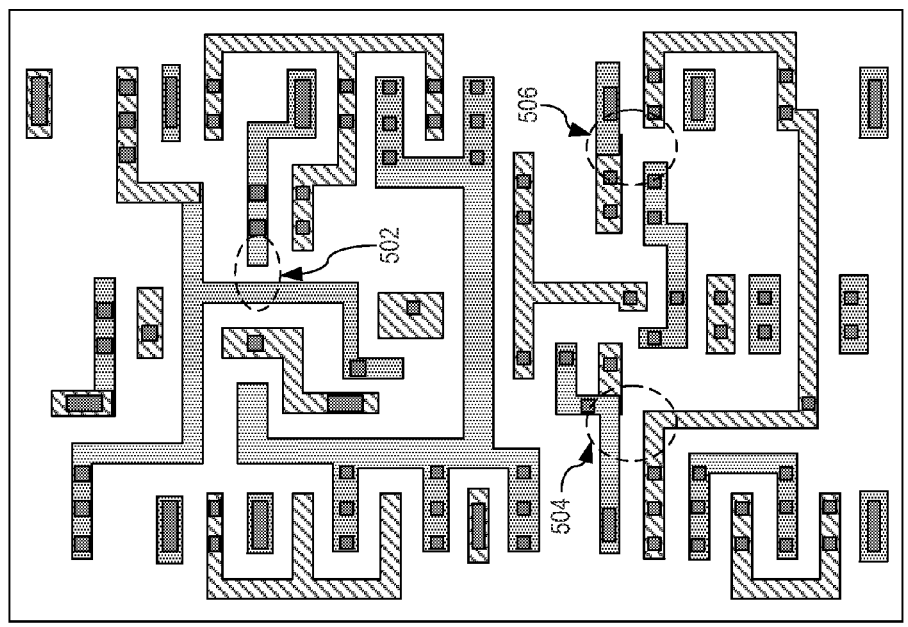
FIG. 5A depicts a two-layer design after design rule checker has been executed in accordance with an illustrative embodiment.

FIG. 5A depicts a two-layer design after design rule checker has been executed in accordance with an illustrative embodiment. In FIG. 5A, the design rule checker has indicated 3 areas 502, 504, and 506 where the split-layer design rules have been violated. In area 502, for example, a tip-to-side spacing rule has been violated. In area 504, for example, a minimum spacing rule has been violated. In area 506, for example, a non-projecting tip-to-tip spacing rule has been violated. FIG. 5B depicts a redesigned two-layer design that addresses the violation identified by the design rule checker in accordance with an illustrative embodiment. In FIG. 5B, area 512 has been redesigned by shortening the shape that violated one of the split-layer design rules. Area 514 has been redesigned by rerouting one of the shapes that violated one of the split-layer design rules. Area 516 has been redesigned by rerouting two shapes that violated one of the split-layer design rules. The shape layout in FIG. 5A and 5B are only examples and are not intended to assert or imply any limitation with regard to the environments in which aspects or embodiments of the present invention may be implemented.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more Programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 6:
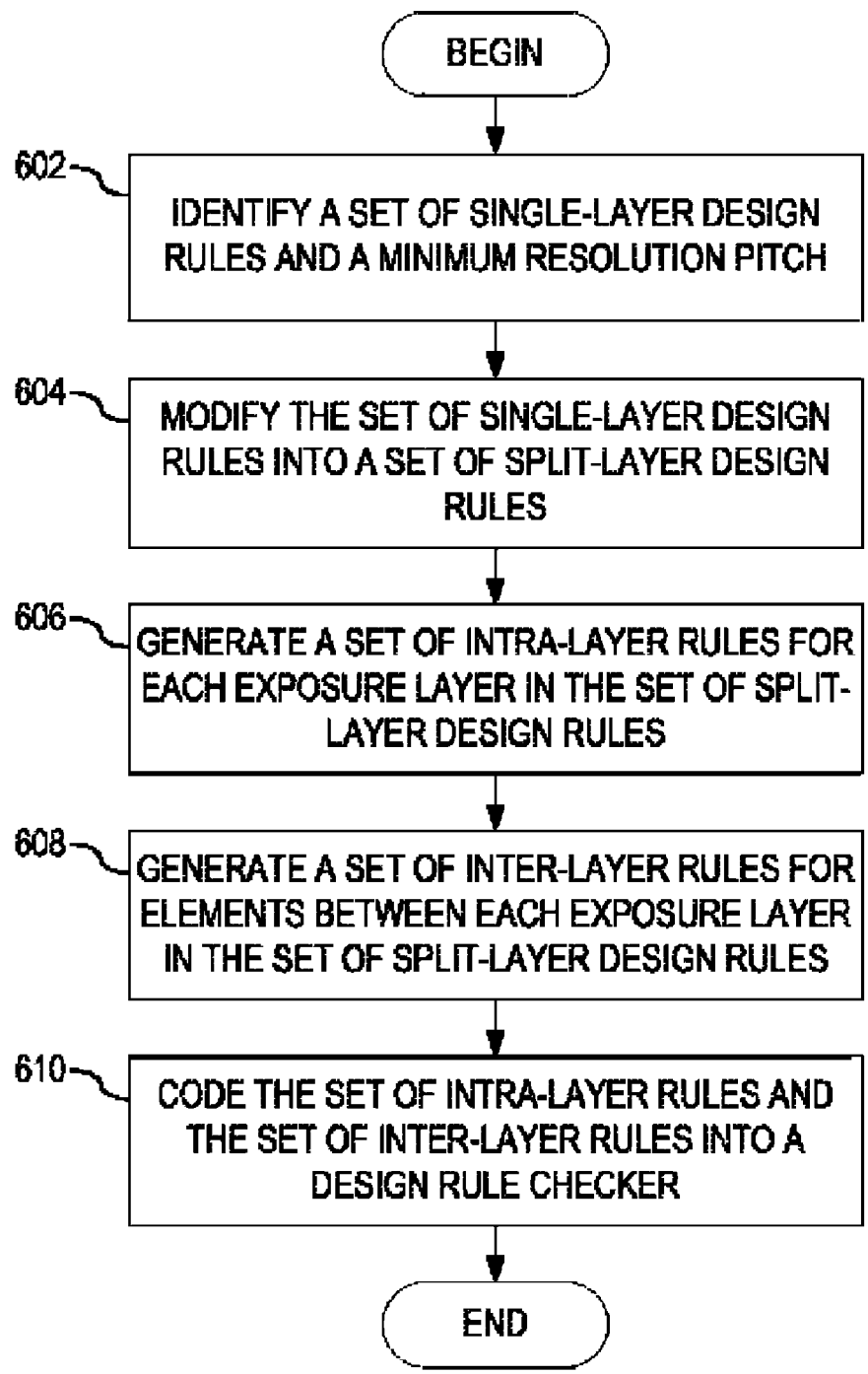
FIG. 6 depicts a flow diagram of the operation performed in generating a set of split-layer design rules in accordance with an illustrative embodiment.
Figure 7:
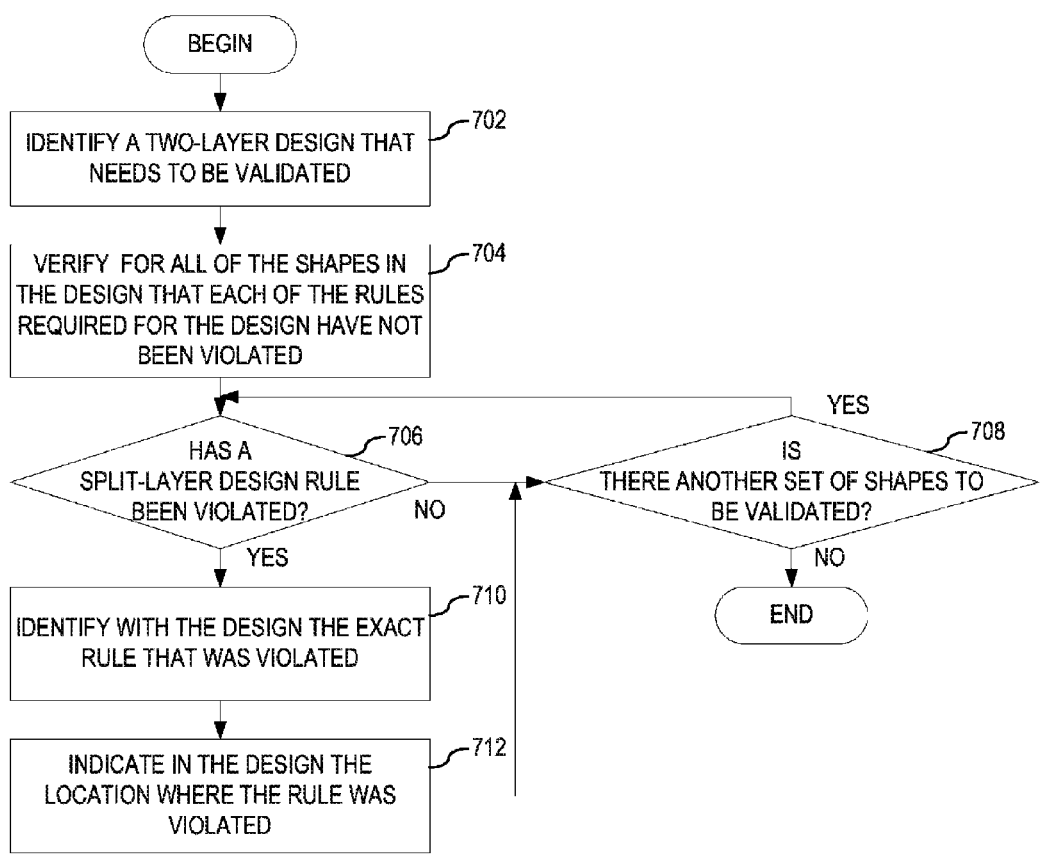
FIG. 7 depicts a flow diagram of the operation performed in enforcing the set of split-layer design rules in accordance with an illustrative embodiment.

Referring now to FIGS. 6-7, these figures provide flowcharts outlining example operations of a mechanism for expressing double patterning lithography (DPL) decomposition constraints as a set of split-layer design rules that may be used during a design stage. FIG. 6 depicts a flow diagram of the operation performed in generating a set of split-layer design rules in accordance with an illustrative embodiment. As the operation begins, the design rule generator identifies a set of single-layer design rules and a minimum resolution pitch (step 602). The design rule generator then modifies the set of single-layer design rules into a set of split-layer design rules (step 604). The design rule generator generates a set of intra-layer rules for each exposure layer in the set of split-layer design rules (step 606). The design rule generator then generates a set of inter-layer rules for elements between each exposure layer in the set of split-layer design rules (step 608). The design rule generator then codes the set of intra-layer rules and the set of inter-layer rules into a design rule checker (step 610), with the operation ending thereafter.

FIG. 7 depicts a flow diagram of the operation performed in enforcing the set of split-layer design rules in accordance with an illustrative embodiment. As the operation begins, a design rule checker identifies a two-layer design that needs to be validated (step 702). The design rule checker verifies for all of the shapes in the design that each of the rules required for the design have not been violated (step 704). For each set of shapes, the design rule checker determines whether a split-layer design rule has been violated (step 706). If at step 706 a current set of shapes does not violate one or more of the split-layer design rules, then the design rule generator determines if there is another set of shapes to validate (step 708). If at step 708 there is another set of shapes to validate, then the operation returns to step 706. If at step 708 there is not another set of shapes to validate, then the operation ends. If at step 706 the set of shapes violates one or more split-layer design rules, then the design rule checker identifies with the design the exact rule that was violated (step 710) and indicates in the design the location where the rule was violated (step 712), with the operation proceeding to step 708 thereafter.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide mechanisms for expressing double patterning lithography (DPL) decomposition constraints as a set of split-layer design rules. Using the DPL split-layer design rules, DPL coloring constraints may be enforced during the design stage versus current methods that are implemented post-design in the decomposition stage. By implementing the DPL split-layer design rules in the design phase, no expensive post-design layout decomposition or conflict removal is required.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention, for various embodiments with various modifications as are suited to the particular use contemplated.

What is claimed is:

1. A method, in a data processing system, for converting a set of single-layer design rules into a set of split-layer design rules for double patterning lithography (DPL), the method comprising:
   identifying, by a processor in the data processing system, the set of single-layer design rules and minimum lithographic resolution pitch constraints for single exposure, wherein the set of single-layer design rules comprise a first plurality of minimum distances that are required by a set of first shapes in a single-layer design;
   modifying, by the processor, each of the first plurality of minimum distances in the set of single-layer design rules with regard to the minimum lithographic resolution pitch constraints for single exposure, thereby forming the set of split-layer design rules, wherein the set of split-layer design rules comprise at least a second plurality of minimum distances that are required by at least a set of second shapes and a set of third shapes in a split-layer design; and
   coding, by the processor, the set of split-layer design rules into a design rule checker for use in designing a double patterning lithography design.

2. The method of claim 1, wherein the set of split-layer design rules comprise a set of intra-layer rules for each exposure layer in the set of split-layer design rules and a set of inter-layer rules for elements between each exposure layer in the set of split-layer design rules.

3. The method of claim 1, further comprising:
   generating, by the processor, a set of minimum overlap rules using a set of technology specific overlay specifications.

4. The method of claim 1, wherein generating the set of split-layer design rules includes multiplying a subset of the first plurality of minimum distances by a multiplier while another subset of the first plurality of minimum distances are reused, wherein the multiplier is determined based on the minimum lithographic resolution pitch constraints for the single exposure.

5. The method of claim 1, further comprising:
identifying, by the processor, a two-layer design to be validated using the set of split-layer design rules;
verifying, by the processor, for each shape in a plurality of shapes in the two-layer design, that each of the set of split-layer design rules required for the design have not been violated; and
responsive to the two-layer design failing to violate any of the set of split-layer design rules, generating, by the processor, a validated two-layer design.

6. The method of claim 5, further comprising:
responsive to two-layer design violating at least one of the set of split-layer design rules, identifying, by the processor, at least one of the set of split-layer design rules that is violated; and
indicating, by the processor, within the two-layer design, a location of where the at least one of the set of split-layer design rules is violated.

7. The method of claim 5, wherein verifying that each of the set of split-layer design rules required for the design-have not been violated comprises:
examining, by the processor, each polygon in the two-layer design;
measuring, by the processor, at least one layout parameter in the two-layer design for a set for layout features thereby forming a set of measurements; and
comparing, by the processor, the set of measurements to the set of split-layer design rules in order to identify violations of the set of split-layer design rules.

8. A computer program product comprising a non-transitory computer readable storage medium having a computer readable program stored therein, wherein the computer readable program, when executed on a computing device, causes the computing device to:
identify a set of single-layer design rules and minimum lithographic resolution pitch constraints for single exposure, wherein the set of single-layer design rules comprise a first plurality of minimum distances that are required by a set of first shapes in a single-layer design;
modify each of the first plurality of minimum distances in the set of single-layer design rules with regard to the minimum lithographic resolution pitch constraints for single exposure, thereby forming a set of split-layer design rules, wherein the set of split-layer design rules comprise at least a second plurality of minimum distances that are required by at least a set of second shapes and a set of third shapes in a split-layer design; and
code the set of split-layer design rules into a design rule checker for use in designing a double patterning lithography design.

9. The computer program product of claim 8, wherein the set of split-layer design rules comprise a set of intra-layer rules for each exposure layer in the set of split-layer design rules and a set of inter-layer rules for elements between each exposure layer in the set of split-layer design rules.

10. The computer program product of claim 8, wherein the computer readable program further causes the computing device to:
generate a set of minimum overlap rules using a set of technology specific overlay specifications.

11. The computer program product of claim 8, wherein the computer readable program to generate the set of split-layer design rules further causes the computing device to multiply a subset of the first plurality of minimum distances by a multiplier while another subset of the first plurality of minimum distances are reused, wherein the multiplier is determined based on the minimum lithographic resolution pitch constraints for the single exposure.

12. The computer program product of claim 11, wherein the computer readable program further causes the computing device to:
identify a two-layer design to be validated using the set of split-layer design rules;
verify, for each shape in a plurality of shapes in the two-layer design, that each of the set of split-layer design rules required for the design have not been violated; and
responsive to the two-layer design failing to violate any of the set of split-layer design rules, generate a validated two-layer design.

13. The computer program product of claim 11, wherein the computer readable program further causes the computing device to:
responsive to the two-layer design violating at least one of the set of split-layer design rules, identify at least one of the set of split-layer design rules that is violated; and
indicate, within the two-layer design, a location of where the at least one of the set of split-layer design rules is violated.

14. The computer program product of claim 11, wherein the computer readable program to verify that each of the set of split-layer design rules required for the design have not been violated further causes the computing device to:
examine each polygon in the two-layer design;
measure at least one layout parameter in the two-layer design for a set for layout features thereby forming a set of measurements; and
compare the set of measurements to the set of split-layer design rules in order to identify violations of the set of split-layer design rules.

15. An apparatus, comprising:
a processor; and
a memory coupled to the processor, wherein the memory comprises instructions which, when executed by the processor, cause the processor to:
identify a set of single-layer design rules and minimum lithographic resolution pitch constraints for single exposure, wherein the set of single-layer design rules comprise a first plurality of minimum distances that are required by a set of first shapes in a single-layer design;
modify each of the first plurality of minimum distances in the set of single-layer design rules with regard to the minimum lithographic resolution pitch constraints for single exposure, thereby forming a set of split-layer design rules, wherein the set of split-layer design rules comprise at least a second plurality of minimum distances that are required by at least a set of second shapes and a set of third shapes in a split-layer design; and
code the set of split-layer design rules into a design rule checker for use in designing a double patterning lithography design.

16. The apparatus of claim 15, wherein the set of split-layer design rules comprise a set of intra-layer rules for each exposure layer in the set of split-layer design rules and a set of interlayer rules for elements between each exposure layer in the set of split-layer design rules.

17. The apparatus of claim 15, wherein the instructions further cause the processor to:
generate a set of minimum overlap rules using a set of technology specific overlay specifications.

18. The apparatus of claim 15, wherein the instructions to generate the set of split layer design rules further cause the processor to multiply a subset of the first plurality of minimum distances by a multiplier while another subset of the first plurality of minimum distances are reused, wherein the multiplier is determined based on the minimum lithographic resolution pitch constraints for the single exposure.

19. The apparatus of claim 18, wherein the instructions further cause the processor to:
   identify a two-layer design to be validated using the set of split-layer design rules;
   verify, for each shape in a plurality of shapes in the two-layer design, that each of the set of split-layer design rules required for the design have not been violated; and
   responsive to the two-layer design failing to violate any of the set of split-layer design rules, generate a validated two-layer design.

20. The apparatus of claim 18, wherein the instructions further cause the processor to:
   responsive to the two-layer design violating at least one of the set of split-layer design rules, identify at least one of the set of split-layer design rules that is violated; and
   indicate, within the two-layer design, a location of where the at least one of the set of split-layer design rules is violated.

21. The apparatus of claim 18, wherein the instructions to verify that each of the set of split-layer design rules required for the design have not been violated further cause the processor to:
   examine each polygon in the two-layer design;
   measure at least one layout parameter in the two-layer design for a set for layout features thereby forming a set of measurements; and
   compare the set of measurements to the set of split-layer design rules in order to identify violations of the set of split-layer design rules.

* * * * *